(12) United States Patent
Nagarajan et al.

(10) Patent No.: US 11,050,424 B1
(45) Date of Patent: Jun. 29, 2021

(54) CURRENT-MIRROR BASED LEVEL SHIFTER CIRCUIT AND METHODS FOR IMPLEMENTING THE SAME

(71) Applicant: SAMSUNG ELECTRONICS CO., LTD., Suwon-si (KR)

(72) Inventors: Hareharan Nagarajan, Bangalore (IN); Sajal Mittal, New Delhi (IN); Abdur Rakheeb, Bangalore (IN); Nandish Uppal Raravi, Bangalore (IN); Vinod Sharma, Bangalore (IN)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/894,201

(22) Filed: Jun. 5, 2020

(30) Foreign Application Priority Data

Mar. 4, 2020 (IN) .............................. 202041009375

(51) Int. Cl.
*H03K 19/0185* (2006.01)
*H03K 3/012* (2006.01)
*H03K 3/037* (2006.01)

(52) U.S. Cl.
CPC ..... *H03K 19/018521* (2013.01); *H03K 3/037* (2013.01)

(58) Field of Classification Search
CPC combination set(s) only.
See application file for complete search history.

(56) References Cited

U.S. PATENT DOCUMENTS

| | | | |
|---|---|---|---|
| 6,177,816 B1* | 1/2001 | Nagata | H03K 19/0016 327/77 |
| 7,295,038 B2 | 11/2007 | Seo | |
| 7,639,043 B2* | 12/2009 | Koike | H03F 3/45237 326/82 |
| 8,653,877 B2 | 2/2014 | Wu et al. | |
| 9,374,090 B2 | 6/2016 | Zhou et al. | |
| 10,432,199 B1* | 10/2019 | Zhang | H03K 19/018507 |
| 2002/0009013 A1* | 1/2002 | Lee | G11C 5/14 365/230.06 |

* cited by examiner

*Primary Examiner* — An T Luu
(74) *Attorney, Agent, or Firm* — Sughrue Mion, PLLC

(57) ABSTRACT

Methods and apparatus for implementing a current-mirror based level shifter circuit are provided. The current-mirror based level shifter circuit includes a current-mirror circuit, a feedback control circuit, a power down circuit and a plurality of inverter circuits. The apparatus is configured to provide a wide voltage shifting range using the current-mirror based level shifter circuit. The apparatus comprising a feedback loop with two diode connected transistors may provide a constant drivability to the node that drives the output, when a current-mirror circuit is turned-off.

20 Claims, 12 Drawing Sheets

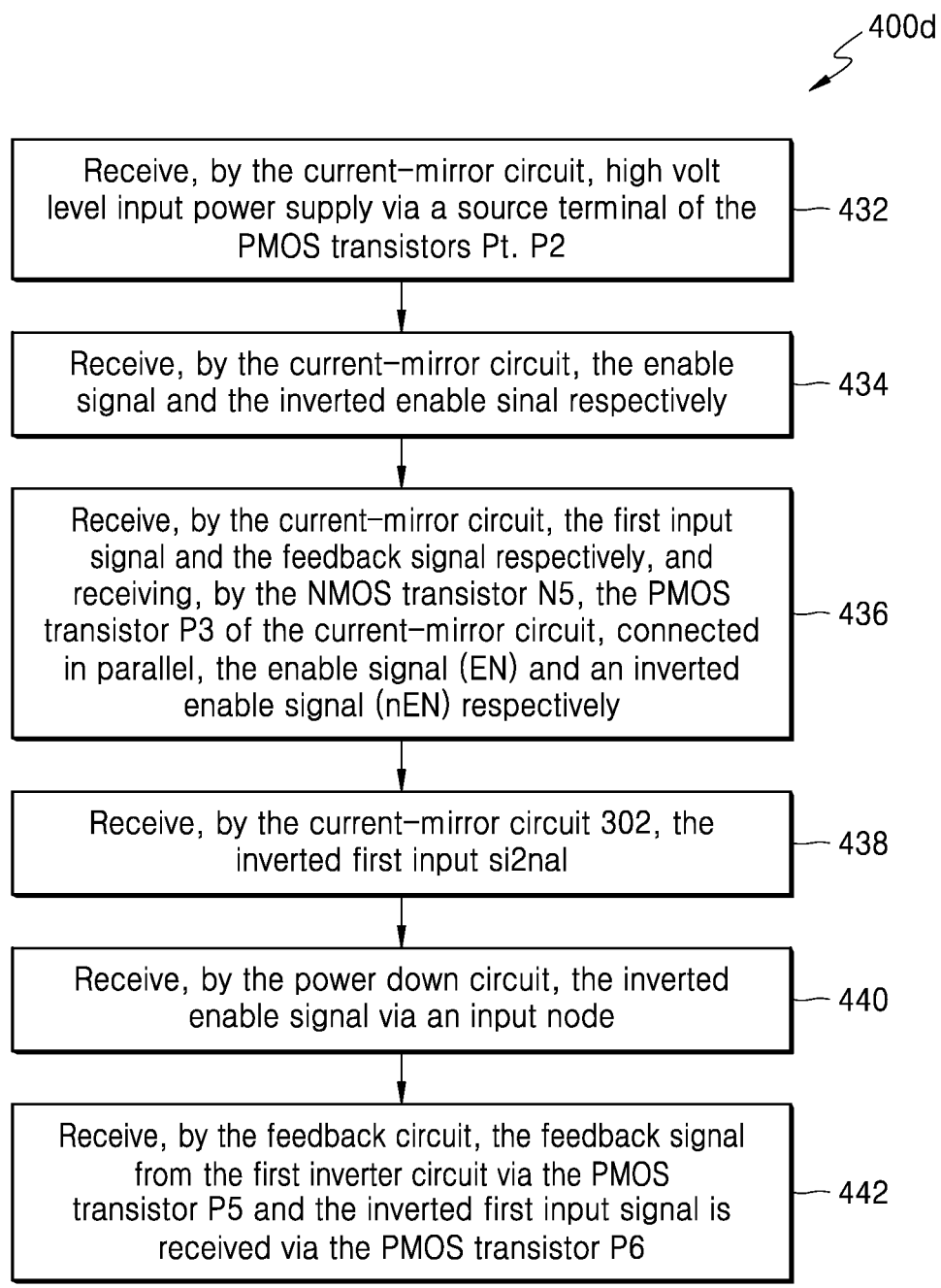

CURRENT-MIRROR BASED LEVEL SHIFTER CIRCUIT AND METHODS FOR IMPLEMENTING THE SAME

This application claims priority from Indian Patent Application No. 202041009375, filed on Mar. 4, 2020, in the Indian. Patent Office, the disclosure of which is incorporated herein by reference in its entirety.

BACKGROUND

The present disclosure relates to level shifter circuits, and more particularly to methods and apparatus for implementing a current-mirror based level shifter circuit.

In general, circuits that use higher power supply voltages, and the circuits that use different supply voltages may communicate with each other using a level shifter circuit. The level shifter circuit is a circuit that translates logical signals of one voltage level to logical signals of another voltage level. A high voltage level shifter circuit maybe typically used for low voltage to high voltage control signal conversion. For example, a large scale liquid crystal display (LCD) system requires 20 volts to 40 volts to turn on thin-film transistors (TFTs), however an input signal applied to the LCD driver may be 3 volts. In this case, the high voltage level shifter circuit may be used for voltage conversion from 3 volts to 20 volts.

Further, a current-mirror circuit may be used as a basic building block in linear analog integrated circuits. The current-mirror circuit may be employed as biasing elements, active loads (e.g., such as in amplifier stages) or as all-purpose current sources (e.g., such as bit current cells in analog-to-digital converters). The current-mirror is a current input/output device which, ideally, has zero input impedance and infinite output impedance, so that current output remains a fixed function of current input, regardless of variations in output load, and variations in output voltage or fluctuations in applied power source.

FIG. 1a illustrates a related art different voltage in multi-domains of a System on Chip (SoC). Currently, in lower technology nodes, the conventional systems may be changed from a Metal Oxide Semiconductor Field Effect Transistor (MOSFET) to a Fin shaped Field Effect Transistor (FinFET) for scaling down the layout in circuit. Due to scaling of the layout, the minimum operating voltage (Vmin) may become lower, and with multiple power domains present in an SoC, the level shifter circuits with less propagation delay that can shift voltage to a wide range may be required.

FIG. 1b illustrates a related art cross-coupled level shifter circuit. The related art cross-coupled level shifter circuit shown in the FIG. 1B is an up-level shifter for translating a lower voltage domain (VDD) to a higher voltage domain (VDDO). The related art cross-coupled level shifter circuit comprises of approximately 23 transistors and may be functional with respect to an enable signal. Accordingly, when the enable signal is high, the related art circuit may translate the voltage level and when the enable signal is low, the conventional circuit may retain output at an active low state. However, the related art cross-coupled circuit may have limited shifting range and may be less robust for higher voltage shifting ranges.

FIG. 1c illustrates a related art level shifter circuit having a current-mirror configuration. A digital circuit such as the related art level shifter circuit includes the current-mirror configuration. Further, the related art level shifter circuit may include a first and a second current supply transistors that may be configured to provide an output signal to an output node based on an input signal. A leakage current control circuit in the related art circuit may be configured to maintain the first and second current supply transistors in an off state in response to the output signal. An output compensation circuit coupled to the output node may be configured to maintain a voltage level of the output node based on a level of output signal.

However, the related art methods and apparatus may not provide a robust method for wide voltage shifting range by utilizing less area on the layout of the circuit. Further, the related art current-mirror configuration based level-shifter circuits may have more static current and more leakage current.

SUMMARY

Example embodiments provide a current-mirror based level shifter circuit and methods for the implementation and operation of the current-mirror based level shifter circuit.

Further, example embodiments provide methods and apparatus for mitigating a contention current and a switching current in the current-mirror based level shifter circuit.

Further still, example embodiments provide methods and apparatus for disabling the path between circuits based on the output of previous circuit.

Further still, example embodiments provide methods and apparatus far level shifting a low voltage input signal to a wide range high voltage signal.

Provided herein is an exemplary current-mirror-based level shifter circuit including a current-mirror circuit, wherein the current-mirror circuit is configured to generate at a first node, based on a input signal and a feedback signal, a first output signal; a feedback control circuit coupled to the current-mirror circuit at the first node, wherein the feedback control circuit comprises a first inverter circuit, a first diode-connected p-channel metal oxide semiconductor (PMOS) transistor and a second diode-connected PMOS transistor, wherein the feedback control circuit is configured to provide, to the first node based on an inverted input signal and the feedback signal, a first level-shifted output signal, wherein the first inverter circuit is configured to receive the first output signal from the first node; a power-down circuit, wherein the power-down circuit is coupled to the first node, wherein, when the current-mirror-based level shifter circuit is in power-down mode, the power-down circuit is configured to: bring the first node to a low voltage level, thereby powering down the current-mirror-based level shifter circuit, and maintain a stable ground voltage level at an output of the current-mirror-based level shifter circuit; and a second inverter circuit coupled to the feedback control circuit, wherein the second inverter circuit is configured to generate a final level-shifted output signal.

Accordingly, the embodiments herein provide a method for implementing a current-mirror based level shifter circuit. The method including: generating, by a current-mirror circuit at a first node, a first output signal based on an input signal and a feedback signal; generating, by a feedback control circuit coupled to the current-mirror circuit at the first node, a level shifted output signal based on receiving an inverted input signal and the feedback signal, wherein the feedback control circuit comprises a first inverter circuit, a first diode-connected p-channel metal oxide semiconductor (PMOS) transistor and a second diode-connected PMOS transistor, providing, to the first node based on the inverted input signal and the feedback signal, a first level-shifted output signal; receiving, by the first inverter circuit, the first output signal from the first node; powering down, by a power down circuit coupled to the first node, when an inverted enable signal is high, the current-mirror-based level shifter circuit to maintain a stable ground voltage level at an output of the current-mirror-based level shifter circuit, wherein the powering down comprises bringing the first node to a low voltage level; and generating, by a second inverter circuit and based on the feedback signal, a final level-shifted output signal.

Provided herein is an exemplary current-mirror-based level shifter circuit including a current-mirror circuit; a first inverter circuit, configured to receive an output from the current-mirror circuit, and generate an inverted current-mirror output signal; a feedback control circuit; a second inverter circuit, wherein the feedback control circuit and the second inverter circuit are configured to: receive the inverted current-mirroroutput signal, and generate a final level shifted output signal; and a power-down circuit, wherein the power-down circuit is configured to power down the current-mirror-based level shifter circuit by bringing an input of the first inverter circuit to a ground voltage, when an inverted enable signal is high.

Also provided herein is a method for implementing a current-mirror-based level shifter circuit, the method comprising: receiving, by a first inverter circuit, an output from a current-mirror circuit; generating, by the first inverter circuit, an inverted current-mirror output signal; receiving, by a second inverter circuit, a voltage from a first node, wherein the first node is connected to an output of a feedback control circuit, to an output of the current-mirror circuit, and to a power-down circuit; generating by the second inverter circuit, a final level-shifted output signal based on the voltage from the first node; and powering down, by the power-down circuit, the current-mirror-based level shifter circuit bringing the first node to a ground voltage level when an inverted enable signal is high.

BRIEF DESCRIPTION OF THE DRAWINGS

Example embodiments herein will be more clearly understood from the following description with reference to the drawings, in which:

FIG. 4d is flow chart depicting a method for receiving a feedback signal from a first inverter circuit and an inverted first input signal, according to an example embodiment;

DETAILED DESCRIPTION

Figure 1A:
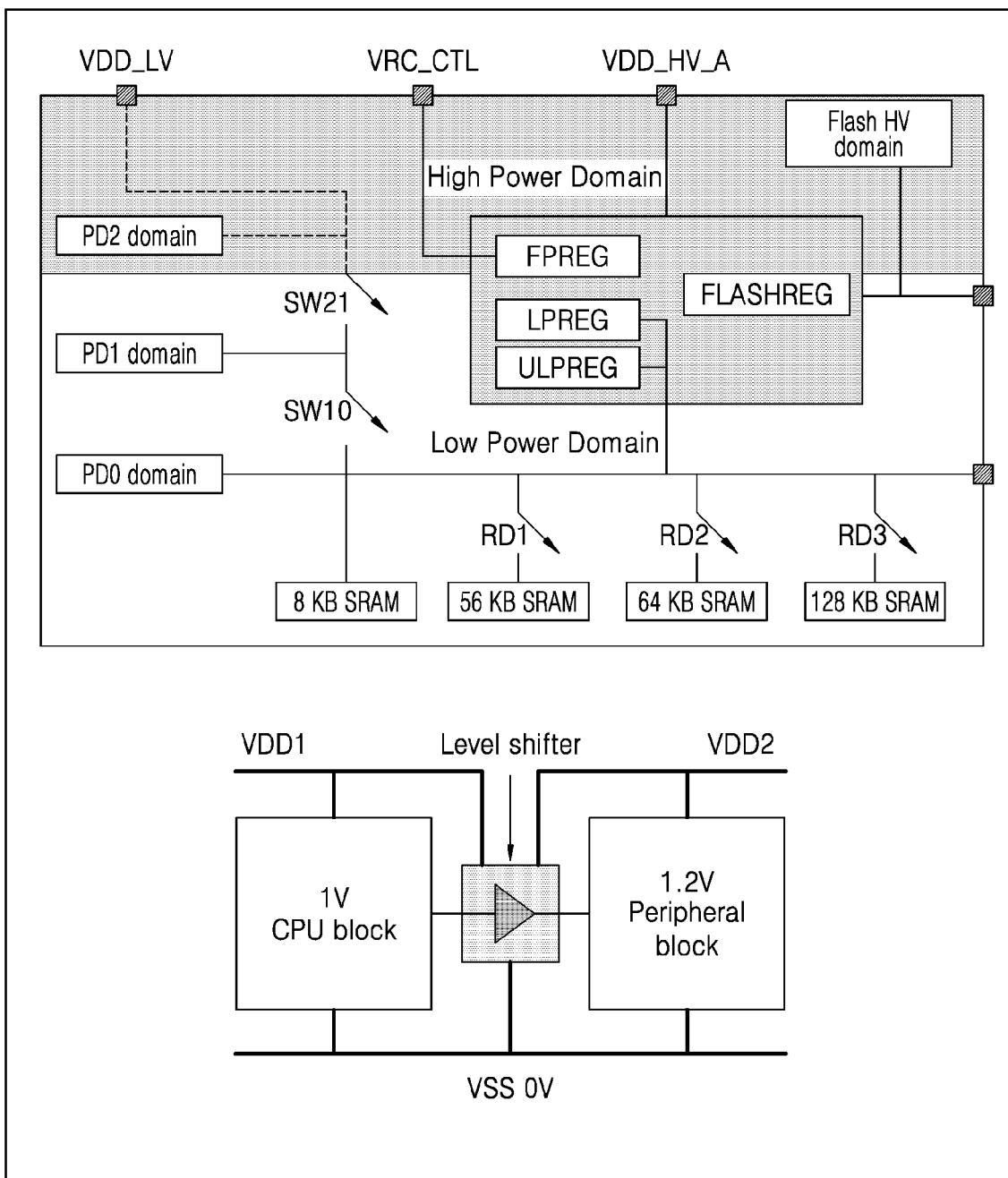
FIG. 1a illustrates a related art different voltage in multi-domains of an SoC.
Figure 1B:
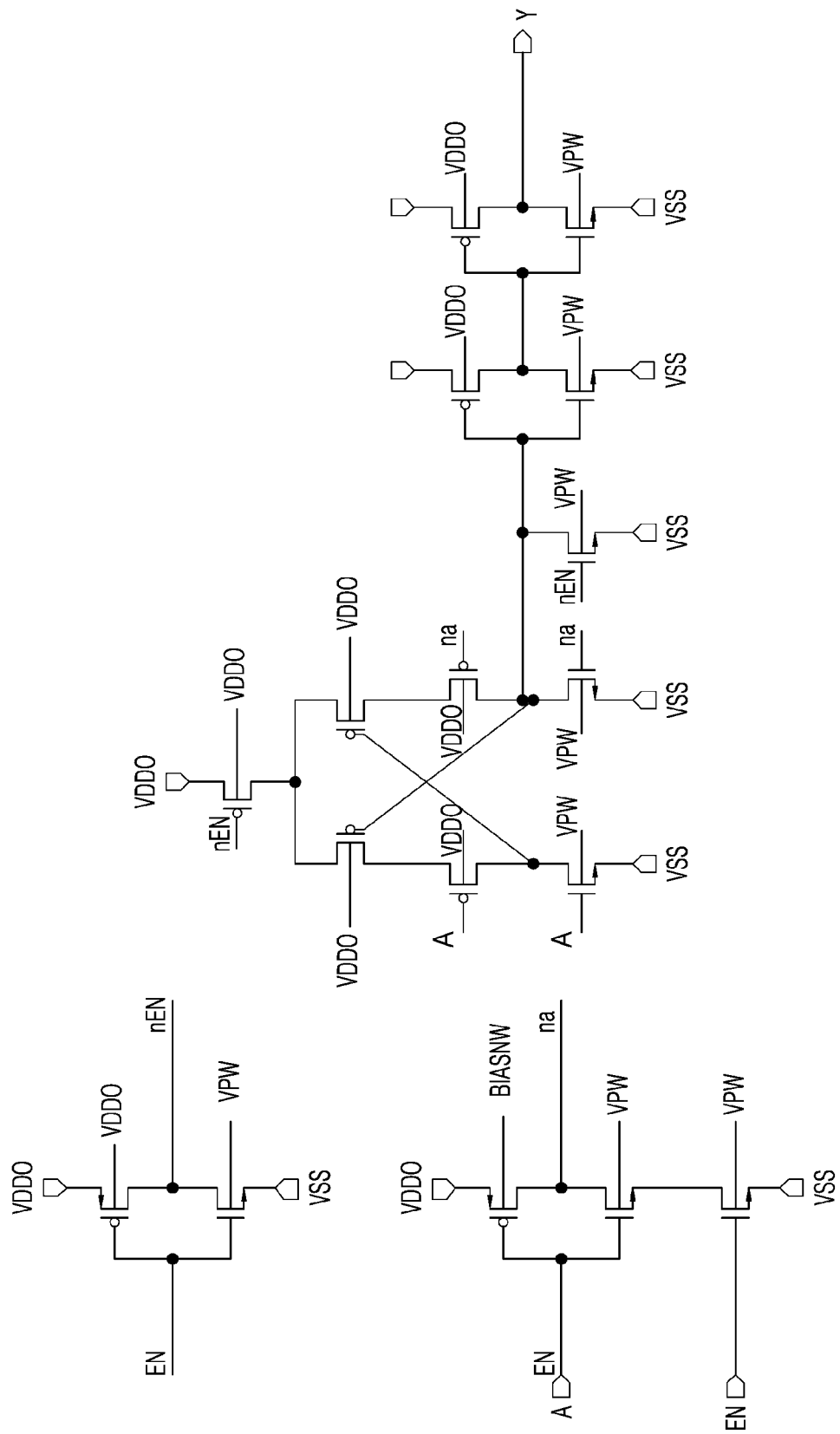
FIG. 1b illustrates a related art cross-coupled level shifter circuit.
Figure 1C:
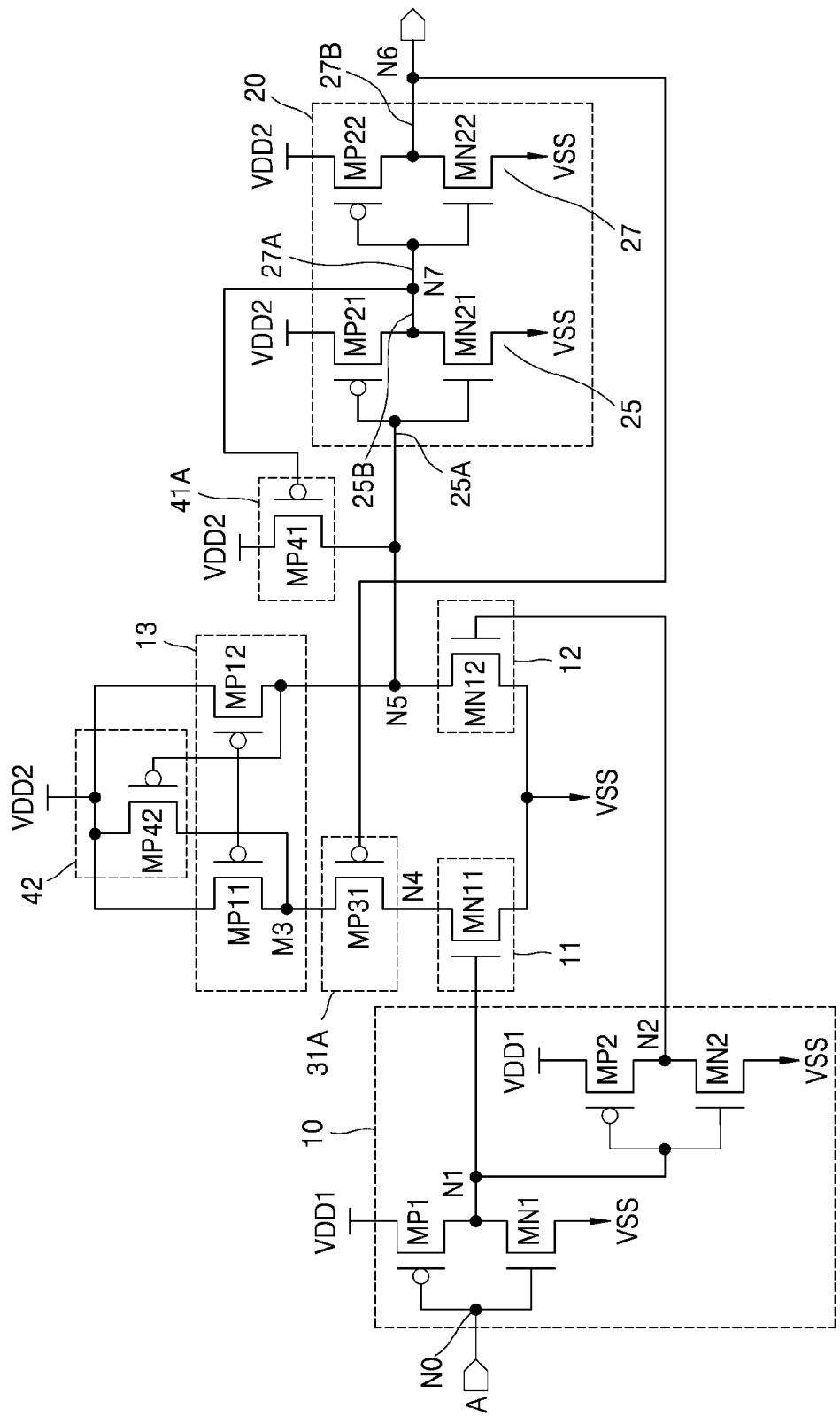
FIG. 1c illustrates a related art level shifter circuit having a current-mirror configuration.

Example embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The description herein is intended merely to facilitate an understanding of ways in which the example embodiments herein can be practiced and to further enable those of skill in the art to practice the example embodiments herein. Accordingly, this disclosure should not be construed as limiting the scope of the example embodiments herein.

In embodiments herein, when an element is referred to as being "coupled", "connected" or "responsive" to another element, it can be directly coupled, connected or responsive to the other element or intervening elements may also be present. As used herein the term "and/or" includes any and all combinations of one or more of the associated listed items and may be abbreviated by "/". It will also be understood that, although the terms first, second, etc. may be used herein to describe various elements, these elements should not be limited by these terms. These terms are only used to distinguish one element from another element.

The embodiments herein achieve a current-mirror based level shifter circuit and methods for the implementation and operation of the current-mirror based level shifter circuit. Referring now to the drawings, and more particularly to FIGS. 2 through 4f, where similar reference characters denote corresponding features consistently throughout the figures, there are shown example embodiments.

Figure 2:
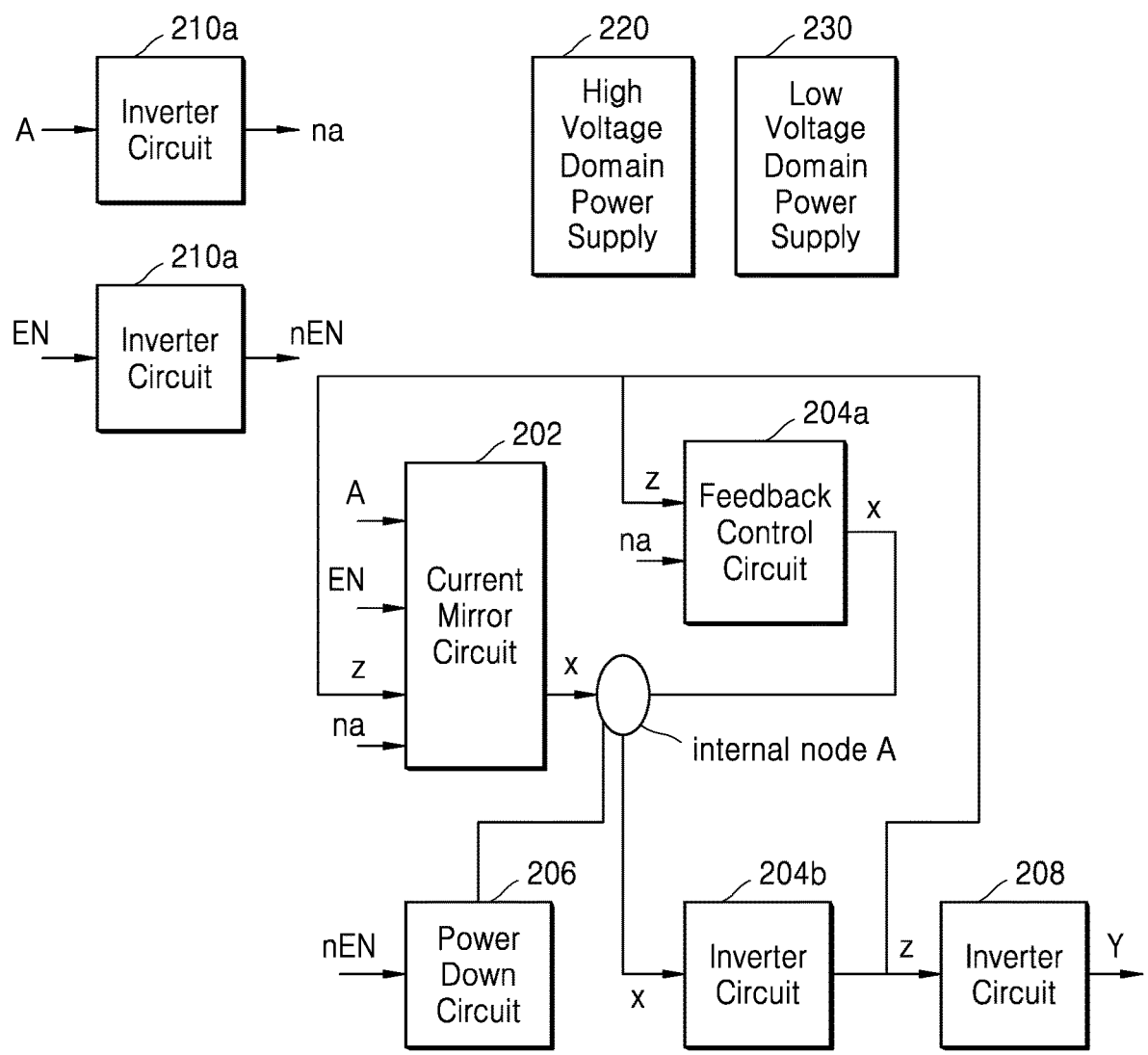
FIG. 2 illustrates a current-mirror based level shifter circuit at a block diagram level.

FIG. 2 illustrates an inverter circuit 210a with an input A and an output na, an inverter circuit 210b with an input EN and an output nEN according to an example embodiment. FIG. 2 also illustrates a high voltage domain power supply 220 and a low voltage domain power supply 230. In addition, FIG. 2 illustrates a current mirror circuit 202, a feedback control circuit 204a, a power down circuit 206, an inverter circuit 204b and an inverter circuit 208 with output Y.

A is an input signal.

EN is an enable signal.

z is an intermediate level-shifted output.

x is an internal voltage which is influenced by one or more of the current mirror circuit 202 the feedback control circuit 204a and the power down circuit 206.

The power down circuit 206 is able to pull the voltage x to ground.

Figure 3A:
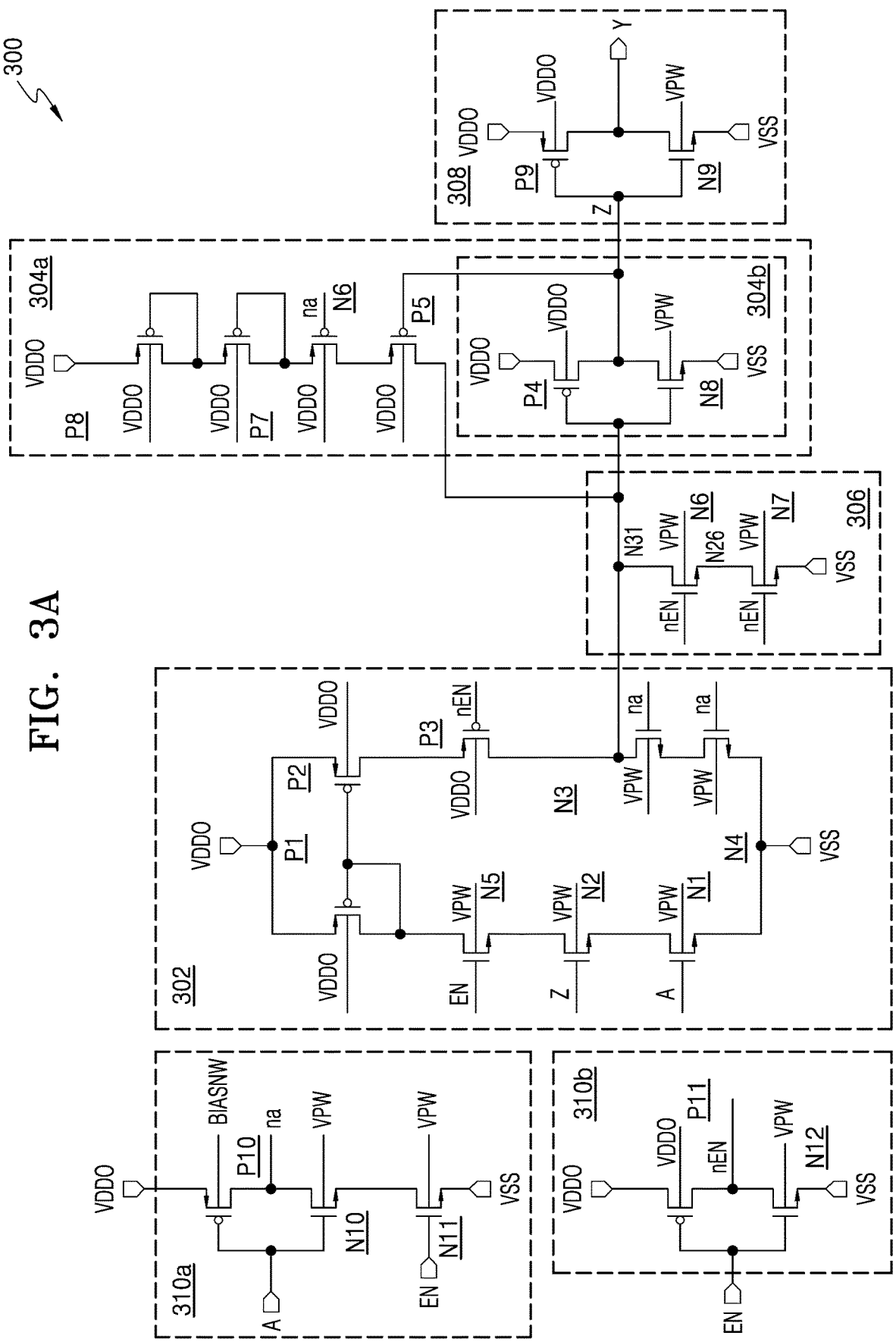
FIG. 3a illustrates a circuit diagram of a current-mirror based level shifter circuit, according to an example embodiment.

FIG. 3a illustrates a circuit diagram of a current-mirror based level shifter circuit 300, according to an example embodiment.

Further details of the circuit components of FIG. 2 are given in FIG. 3a. For example, further details of FIG. 2 item 210a are given by FIG. 3a item 310a. This correspondence is shown as follows using {FIG. 2 item, FIG. 3a item}. Specifically, the labelling correspondence is applicable for the remaining items between FIGS. 2 and 3a as follows:

{210a details in 310a}, {210b details in 310b}, {202 details in 302}, {206 details in 306}, {204a/204b details in 304a/304b}, {208 details in 308}).

The current-mirror based level shifter circuit 300 includes a plurality of circuit blocks such as a current-mirror circuit 302, a feedback control circuit 304a, a first inverter circuit 304b, a power down circuit 306, a second inverter circuit 308, a third inverter circuit 310a and a fourth inverter circuit 310b. The output from the current-mirror circuit 302 can be a first output signal. The output from the feedback control circuit 304a can be a feedback signal. The output from the second inverter circuit 308 can be an inverted level shifted output signal. The output from the third inverter circuit 310a can be an inverted input signal. The output from the fourth inverter circuit 310b can be an inverted enable signal. The circuit blocks/circuits may be interchanged or altered according to design specific requirements. Example embodiments herein may implement the current-mirror based level shifter circuit 300 using a Complementary Metal Oxide Semiconductor (CMOS) transistor. Although, the example embodiments described herein may be implemented using a CMOS transistor, which may be formed using a CMOS fabrication process, it is to be appreciated that embodiments are not limited to such transistor devices and/or such a fabrication process, and the other suitable devices, such as, for example, Field Effect Transistor (FET), finFETs (fin shaped Field Effect Transistors), bipolar junction transistors (BJTs), Metal Oxide Semiconductor Field Effect Transistor (MOSFET), Junction FET Transistor (JFET) and so on, and/or fabrication processes (e.g., bipolar, BiCMOS, and so on), may be similarly employed, with or without modification to the integrated circuits as described in the embodiments herein. Moreover, although embodiments herein are typically fabricated in a silicon wafer, embodiments herein can alternatively be fabricated in wafers comprising other materials, including but not limited to Gallium Arsenide, Indium Phosphide, and so on. However, it is to be understood that the current-mirror based level shifter circuit 300 may be implemented for translating signals from one logic level or voltage domain to another, and so on. Also, the current-mirror based level shifter circuit 300 may include a plurality of PMOS transistors and/or a plurality of NMOS transistors. The PMOS transistors and/or NMOS transistors may be added/removed based on the design specific requirements or to save area in the current-mirror based level shifter circuit 300, and to overcome metal routing congestion or contention current.

The current-mirror based level shifter circuit 300 may be used in at least one of, but not limited to, a low-voltage Application Specific Integrated Circuit (ASIC), an IoT (Internet of thing) chips, a multiple power domain SoC, an interfacing device, a Secure Digital (SD) card, a memory card, a SIM card, a Compact Flash (CF) card, an audio codec, a Universal Asynchronous Receiver Transmitter (UART), a Film Transistor-Liquid Crystal Display (FT-LCD) panels, a piezoelectric motor driver, and so on. For example, the current-mirror based level shifter circuit 300 may be used to control analog switches where the signals involved are bipolar in nature and require dual (+/−5 Volt) supplies. In addition, the current-mirror circuit 302 may copy a current through one active device by controlling the current in another active device of the apparatus or device, keeping the output current constant regardless of loading. Further, the current being copied can be a varying signal current. The current-mirror circuit 302 can bean inverting current amplifier that may also reverse the current direction. The current-mirror circuit 302 may also include a current-controlled current source (CCCS). The current-mirror circuit 302 may be used to provide bias currents and active loads to other circuits in the current-mirror based level shifter circuit 300. The current-mirror circuit 302 can be implemented with at least one topology such as, but not limited to, a Widlar mirror, a Wilson current, a simple mirror, a cascode mirror, a full cascade mirror, a wide swing mirror, and so on.

In an example embodiment, the current-mirror circuit 302 may include PMOS transistors P1, P2 and P3. The PMOS transistor P2 and the PMOS transistor P3 are connected in series between a power supply voltage VDDO and the output node of the current-mirror circuit 302, and a PMOS transistor P1 is connected in parallel to the PMOS transistors P2 and P3. Further, a gate terminal of the PMOS transistor P1 is connected to a gate terminal of the PMOS transistor P2. The gate terminal of the PMOS transistor P1 is connected to its drain terminal.

Furthermore, the current-mirror circuit 302 may include NMOS transistors N1, N2 and N5 connected in parallel with the NMOS transistors N3 and N4. The NMOS transistors N3 and N4 are connected in series between the output node of the current-mirror circuit 302 and the ground voltage VSS and connected to the PMOS transistors P2 and P3 in series between the power supply voltage VDDO, and the ground voltage VSS. The NMOS transistors N1, N2 and N5 are connected to PMOS transistor P1 in series between the power supply voltage VDDO and the ground voltage VSS. The transistor N1 receives the first input signal as 'A'. The transistor N2 receives the feedback signal as 'Z'. The transistors N3 and N4 receive an inverted first input signal as 'na', The transistor N5 receives the enable signal as 'EN'. The transistor P3 receives the inverted enable signal as 'nEN'.

In an example embodiment, the feedback control circuit 304a and a first inverter circuit may include PMOS transistors P4 P5, P6, P7, P8 and NMOS transistors N8. The PMOS transistors P5, P6, P7, and P8 are connected in series between the power supply voltage VDDO and the output node. The PMOS transistor P5 may receive input from the output node of the feedback control circuit 304a, The PMOS transistor P6 may receive inverted first signal as an input via a gate terminal. Further, the gate terminal of the PMOS transistor P7 and P8 are connected to source terminal of the respective PMOS transistor P7 and P8. The source terminal of the PMOS transistor P5 is connected to the output node of the current-mirror circuit 302. The first inverter circuit 304b is connected to the output node of the feedback control circuit 304a and the output node of the current-mirror circuit 302. When the preliminary input signal at input node has a low level voltage, the output signal may have a high level (i.e. VDDO).

Consider an example scenario, where the PMOS transistors P7 and P8 were not used or implemented, and the gate voltage of the PMOS transistor P5 and P6 would be maintained at the voltage resulting from subtracting a threshold voltage of the PMOS transistors from the power supply voltage VDDO. Accordingly, without the PMOS transistor P8, a leakage current corresponding to a sub-threshold voltage may flow through the PMOS transistors P5 and P6. Accordingly, if the threshold voltage of the PMOS transistor P6 is lower than the threshold voltage of the PMOS transistor P5, a leakage current proportional to the square of a difference between both of the threshold voltages may flow through P5.

According to an example embodiment, the PMOS transistors (P1 to P11) may be moved/altered to form series and parallel combination(s), and the NMOS transistors (N1 to N12) may be moved/altered to form series and parallel combination(s). Further, operations of the current-mirror based level shifter circuit 300 may be the same even though the PMOS (P1 to P11) and NMOS transistors (N1 to N12) are moved or altered or removed according to design requirements. Further, the width and length (w/l) of the PMOS and NMOS transistors may be varied according to the design requirements. One or more PMOS and NMOS transistors may be removed, if the width and length is more than other transistors.

In an example embodiment, the current-mirror based level shifter circuit 300, comprising the current-mirror circuit 302, is configured to generate a first output signal based on a received first input signal and a feedback signal. In an example embodiment, the current-mirror circuit 302 receives an enable signal, an inverted enable signal, and a plurality of inverted first input signal.

In an example embodiment, the current-mirror based level shifter circuit 300 comprises the feedback control circuit 304a. In an embodiment, the feedback control circuit 304a comprises the first inverter circuit 304b and a diode connected PMOS (p-channel Metal Oxide Semiconductor) transistor P7 and P8, coupled to the current-mirror circuit 302, In an embodiment, the feedback control circuit 304a is configured to generate a level shifted output signal based on receiving the inverted first input signal and the feedback signal. In an embodiment, the first inverter circuit 304b receives the first output signal as an input to the first inverter circuit 304b.

In an example embodiment, the current-mirror based level shifter circuit 300 comprising the power down circuit 306 is coupled to an output node of the current-mirror circuit 302. In an example embodiment, the power down circuit 306 is configured to power down the current-mirror based level shifter circuit 300, to maintain stable ground voltage (VSS) level at the output, when the current-mirror based level shifter circuit 300 is in power down mode. In an example embodiment, the input of the first inverter circuit 304b is brought to ground voltage (VSS) level, when an inverted enable (nEN) signal is high. In an example embodiment, the current-mirror based level shifter circuit 300 comprising the second inverter circuit 308, coupled to the feedback control circuit 304a, is configured to generate a final level shifted output signal.

In an example embodiment, the current-mirror based level shifter circuit 300 comprising the feedback control circuit 304a is configured to mitigate at least one of a contention current and a switching current in PMOS transistors P5 and P6, by the diode connected PMOS transistors P7 and P8, based on suppressing a gate-source voltage below a threshold voltage of the PMOS transistor P6, to turn-off the feedback control circuit 304a during an active low input condition of the current-mirror based level shifter circuit 300. In an example embodiment, the current-mirror based level shifter circuit 300 comprising the third inverter circuit 310a coupled to an input node of n-channel Metal Oxide Semiconductor (NMOS) transistors N3 and N4 and the PMOS transistor P6, is configured to generate the inverted first input signal. In an embodiment, the generated inverted first input signal is provided as an input to NMOS transistors N3, N4 and the PMOS transistor P6; wherein the enable signal (EN) is inputted to the third inverter circuit 310a via a pull-down NMOS transistor N11. In an embodiment, the enable signal can be inputted to the third inverter circuit 310a via a pull-down NMOS transistor N11. In an embodiment, the current-mirror based level shifter circuit 300 comprising the fourth inverter circuit 310b is configured to receive the enable signal via the input node. In an embodiment, the fourth inverter circuit 310b coupled to input node of an NMOS transistor(s) N6, N7 and a PMOS transistor P3, is configured to generate the inverted enable signal (nEN), to provide the inverted enable signal (nEN) as an input to NMOS transistors N6 N7 and a PMOS transistor P3. In an example embodiment, the NMOS transistor N5 receiving the enable signal (EN) as input and the PMOS transistor P3 receiving the inverted enable signal (nEN) as an input, is configured to cut-off the current mirror circuit (302) when the enable signal (EN) is active low.

In an example embodiment, the current-mirror circuit 302 comprising PMOS transistors P1 and P2 is configured to receive high voltage level input power supply via a source terminal of the PMOS transistors P1 and P2. In an example embodiment, the diode connected PMOS transistor P1 is coupled to a gate terminal of the PMOS transistor P2, In an example embodiment, the current-mirror circuit 302 comprises a NMOS transistor N5 and the PMOS transistor P3, connected to the PMOS transistors P1 and P2 respectively, is configured to receive the enable signal and the inverted enable signal respectively. In an example embodiment, the current-mirror circuit 302 comprising the NMOS transistors N1 and N2 connected in series is configured to receive the first input signal and the feedback signal respectively, and the NMOS transistor (N5), the PMOS transistor (P3) connected in parallel is configured to receive enable signal (EN) and an inverted enable signal (nEN) respectively. In an embodiment, the current-mirror circuit 302 comprising the NMOS transistors N3, N4 in series is connected to the PMOS transistor P3 is configured to receive the inverted first input signal. In an embodiment, the NMOS transistors N3, N4 is connected between an output node and a ground node of the current-mirror circuit 302. In an example embodiment, the current-mirror based level shifter circuit 300 comprising the power down circuit 306 is configured to receive the inverted enable signal via an input node. In an embodiment, the power down circuit 306 comprises the NMOS transistor N6 and N7 in series is coupled to an output node of the current-mirror circuit 302. In an example embodiment, the current-mirror based level shifter circuit 300 comprising the feedback circuit 304a includes the PMOS transistors P5, P6, P7, and P8 in series. In an example embodiment, the drain terminal of the PMOS transistor P5 is connected to an output node of the current-mirror circuit 302. In an example embodiment, the feedback circuit 304a is configured to receive the feedback signal from the first inverter circuit 304b via the PMOS transistor P5 and the inverted first input signal is received via the PMOS transistor P6. In an example embodiment, the PMOS transistor P8 is connected to the diode connected PMOS transistor P7, and the diode connected PMOS transistors P7 is connected to a source terminal of the PMOS transistor P6.

In an example embodiment, the current-mirror based level shifter circuit 300 comprises a high voltage domain power supply and a low voltage domain power supply, and the output of the current-mirror based level shifter circuit 300 is a level shifted high voltage domain output signal from the low voltage domain signal. In an embodiment, the third inverter circuit 310a receives the low voltage domain power supply, and the current-mirror circuit 302, the feedback control circuit 304a, the first inverter circuit 304b, the second inverter circuit 308 the fourth inverter circuit 310b receives the high voltage domain power.

Although the example embodiments herein have been described in terms of specific embodiments, various modifications can be made without departing from the scope of the present disclosure. For example, by interchanging the feedback signal Z with its complement Z and vice versa while retaining the inputs A and EN. In an embodiment, the current-mirror based level shifter circuit 300 may also include a plurality of current-mirror circuit 302 connected together in series as initial stages, and the feedback control circuit 304a connected in series as the final stage. Also, the output of the feedback control circuit 304a may be connected to an output driver without the second inverter circuit 308. Further, the PMOS transistors and NMOS transistors may be stack or cascaded according to the design requirement and desired output.

Figure 3B:
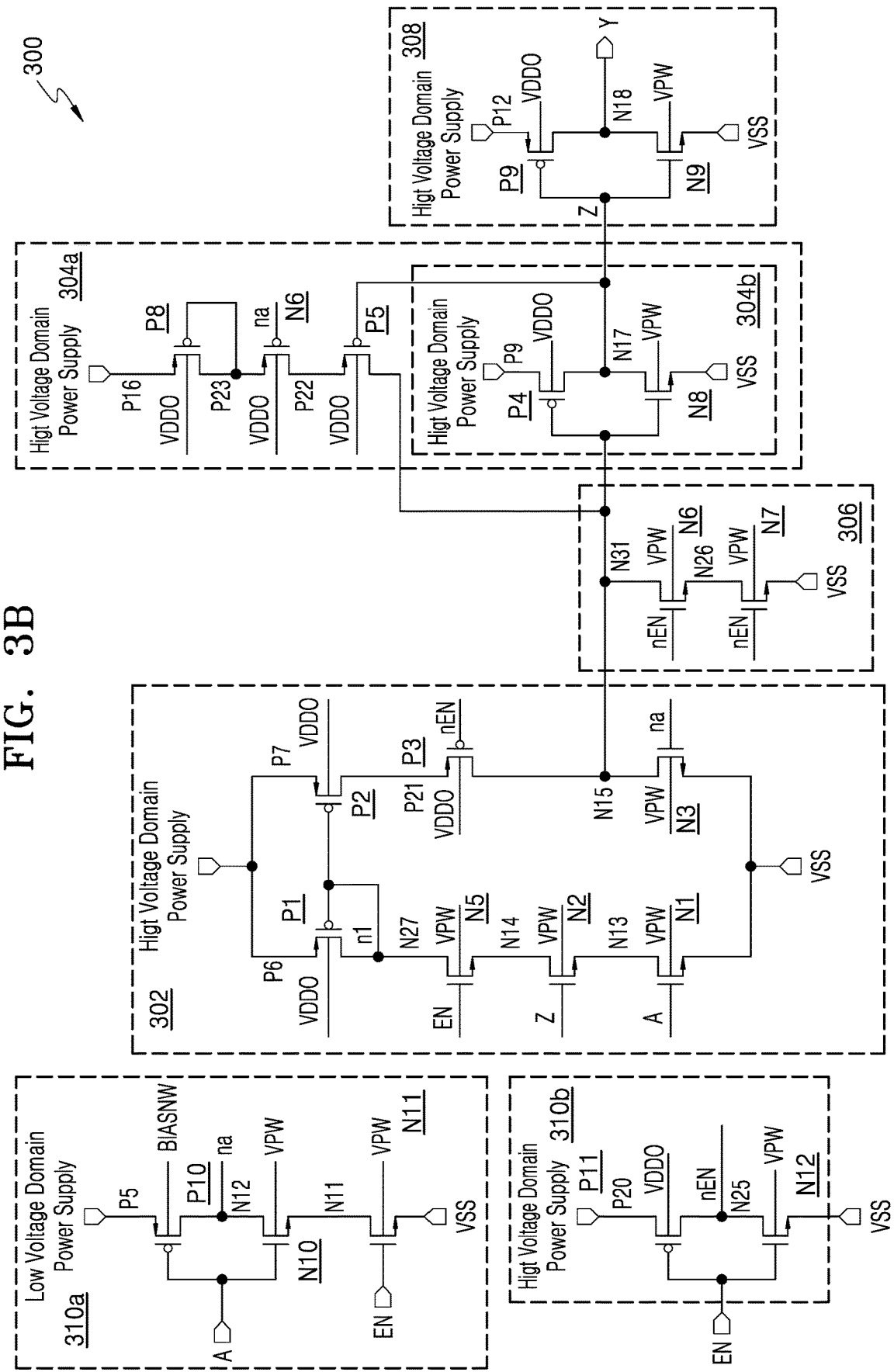
FIG. 3b illustrates a circuit diagram of the current-mirror based level shifter circuit comprising variable width/length (w/l) transistors, according to an example embodiment.

FIG. 3b illustrates a circuit diagram of the current-mirror based level shifter circuit 300 comprising variable width/length (w/l) transistors, according to an example embodiment.

In an example embodiment, the NMOS transistors N3 and N4 in the FIG. 3a are replaced by NMOS transistor N3 in FIG. 3b. The width of the NMOS transistor N3 in FIG. 3b is varied so as to match the strength of the NMOS transistors N3 and N4 in FIG. 3a. Further, the NMOS transistors N3 in the current-mirror circuit 302 is scalable based on required operating voltage for robustness of the current-mirror based level shifter circuit 300. Further, the PMOS transistors P7 and P8 in FIG. 3a are replaced by the PMOS transistors P8 in FIG. 3b The width of the PMOS transistor P8 in FIG. 3b is varied so as to match the strength of the PMOS transistors P7 and P8 in FIG. 3a. Further, the PMOS transistors P7 and P8 in the feedback control circuit 304a are scalable for the required VGS suppression of the PMOS transistor P6, based on required operating voltage for robustness of the current-mirror based level shifter circuit 300.

In an example embodiment, the first inventor circuit 304b is configured to receive output from the current-mirror circuit 302 and generate an inverted current-mirror output signal. In an embodiment, the feedback control circuit 304a and the second inventor circuit 308 is configured to receive the invented current-mirror output signal to generate a final level shifted output signal. In an embodiment, the power down circuit 306 is configured to power down the current-mirror based level shifter circuit 300, when the current-mirror based level shifter circuit 300 is in power down mode. In an embodiment, the input of the first inverter circuit 304b is brought to ground voltage (VSS) level, when an inverted enable (nEN) signal is high.

In an example embodiment, the current-mirror circuit 302 is configured to generate a first output signal from a first input signal, an inverted first input signal, a feedback signal, an enable signal (EN) and an inverted enable signal (nEN). In an example embodiment, the first inverter circuit 304b is configured to receive the first output signal as a first inverter input signal and generate an inverted first output signal. In an embodiment, the feedback control circuit 304a configured to receive the inverted first output signal and the inverted first input signal and generate the feedback signal to drive the first output signal, when the first input signal is high. In an embodiment, the second inverter circuit 308 is coupled to the output of the first inverter circuit (304b) via an input node, is configured to generate the level shifted final output signal.

Although the example embodiments herein may have been described in terms of specific embodiments, various modifications can be made without departing from the scope of the present disclosure. For example, the width and size of the transistors may be varied with respect to each transistor to mitigate or suppress the leakage current or contention current.

Figure 4A:
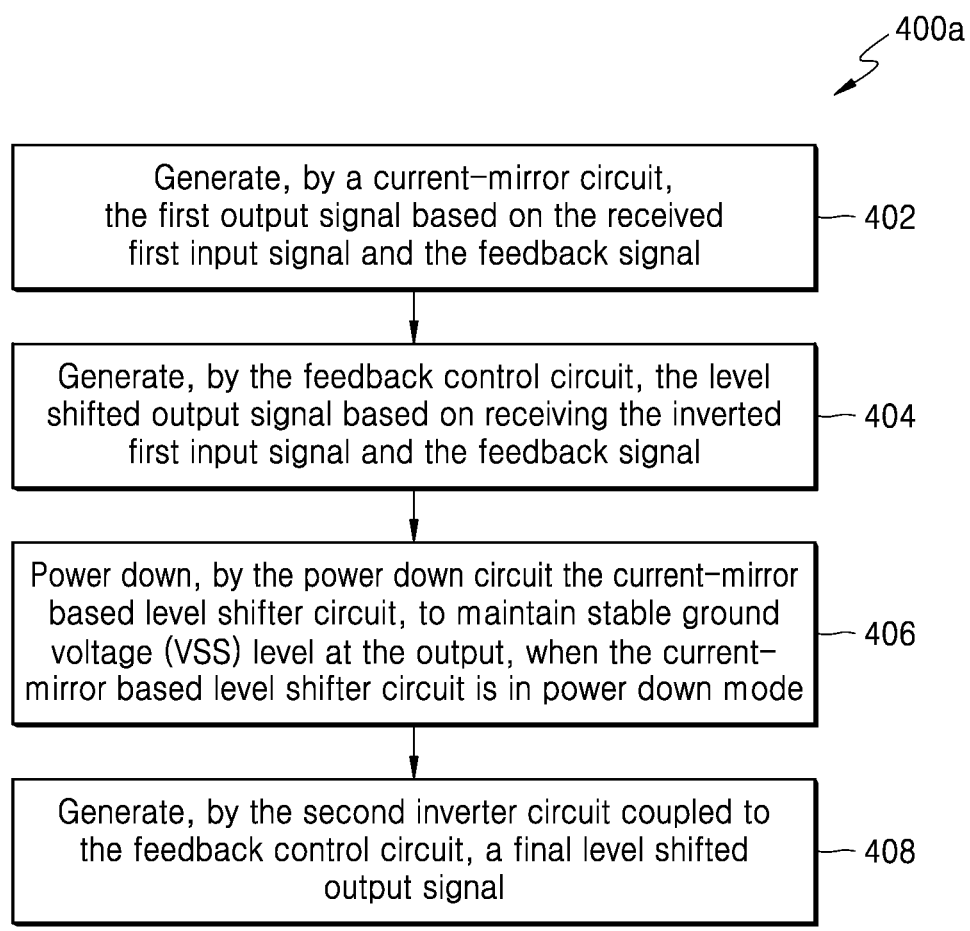
FIG. 4a is a flow chart depicting a method for implementing the current-mirror based level shifter circuit, according to an example embodiment.

FIG. 4a is a flow chart depicting a method 400a for implementing a current-mirror based level shifter circuit 300, according to an example embodiment.

The method 400a includes, at operation 402, generating, by the current-mirror circuit 302, the first output signal based on the received first input signal and the feedback signal. At operation 404, the feedback control circuit 304a generates the level shifted output signal based on receiving the inverted first input signal and the feedback signal. At operation 406, the power down circuit 306 powers down the current-mirror based level shifter circuit 300, to maintain stable ground voltage (VSS) level at the output, when the current-mirror based level shifter circuit 300 is in power down mode. At operation 408, the second inverter circuit 308, coupled to the feedback control circuit 304a, generates a final level shifted output signal.

The various operations in method 400a may be performed in the order presented, in a different order or simultaneously. Further, in some embodiments, some operations listed in FIG. 4a may be omitted.

Figure 4B:
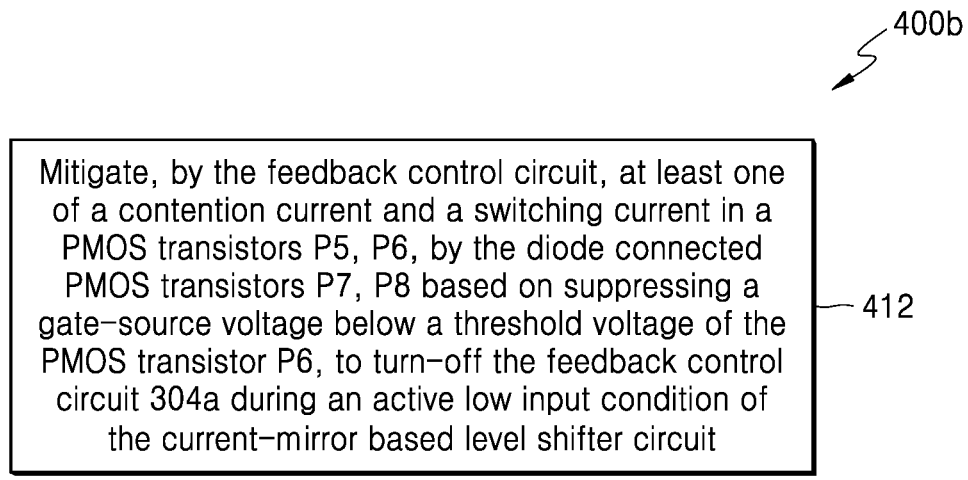
FIG. 4b is flow chart depicting a method for mitigating a contention current and a switching current in PMOS transistors, according to an example embodiment.

FIG. 4b is flow chart depicting a method 400b for mitigating a contention current and a switching current in PMOS transistors, according to an example embodiment.

The method 400b includes, at operation 412, mitigating, by the feedback control circuit 304a, at least one of a contention current and a switching current in a PMOS transistors P5, P6, by the diode connected PMOS transistors P7, P8 based on suppressing a gate-source voltage below a threshold voltage of the PMOS transistor P6, to turn-off the feedback control circuit 304a during an active low input condition of the current-mirror based level shifter circuit 300.

The various operations in method 400b may be performed in the order presented, in a different order or simultaneously. Further, in some embodiments, some operations listed in FIG. 4b may be omitted.

Figure 4C:
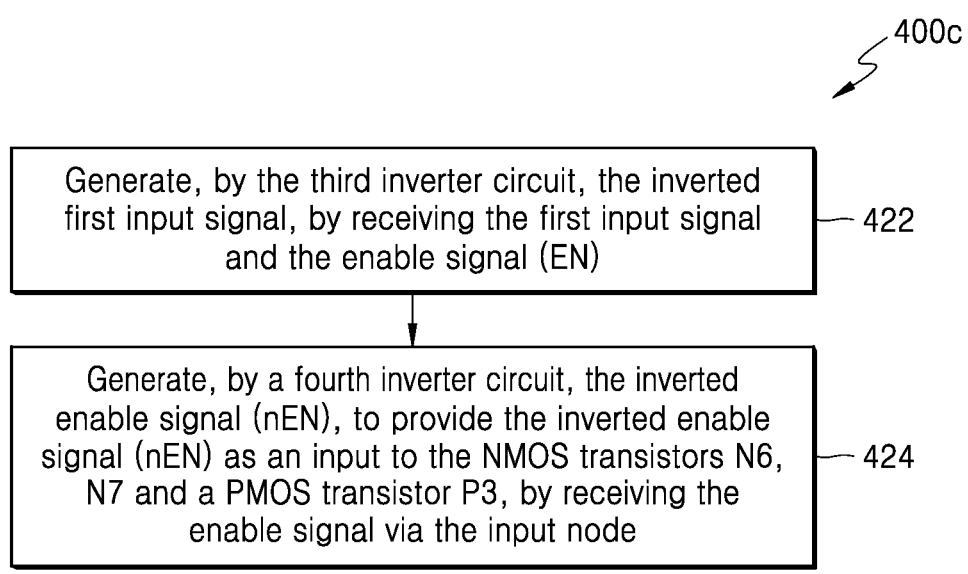
FIG. 4c is flow chart depicting a method for generating n inverted enable signal (nEN), according to an example embodiment.

FIG. 4c is flow chart depicting a method 400c for generating the inverted enable signal (nEN), according to an example embodiment.

The method 400c includes, at operation 422, generating, by the third inverter circuit 310a, the inverted first input signal, by receiving the first input signal and the enable signal (EN). At operation 424, a fourth inverter circuit 310b generates the inverted enable signal (nEN), to provide the inverted enable signal (nEN) as an input to the NMOS transistors N6, N7 and a PMOS transistor P3, by receiving the enable signal via the input node.

The various operations in method 400c may be performed in the order presented, in a different order or simultaneously. Further, in some embodiments, some operations listed in FIG. 4c may be omitted.

FIG. 4d is flow chart depicting a method 400d for receiving the feedback signal from the first inverter circuit 304b and the inverted first input signal, according to an example embodiment.

The method 400d includes, at operation 432, receiving, by the current-mirror circuit 302, high voltage level input power supply via a source terminal of the PMOS transistors P1, P2. At operation 434, the current-mirror circuit 302 receives the enable signal and the inverted enable signal respectively. At operation 436, the current-mirror circuit 302 receives the first input signal and the feedback signal respectively, and the NMOS transistor N5 and the PMOS transistor P3 of the current-mirror circuit 302, connected in parallel, receive the enable signal (EN) and an inverted enable signal (nEN), respectively. At operation 438, the current-mirror circuit 302 receives the inverted first input signal. At operation 440, the power down circuit 306 receives the inverted enable signal via an input node. At operation 442, the feedback circuit 304a receives the feedback signal from the first inverter circuit 304b via the PMOS transistor P5 and the inverted first input signal via the PMOS transistor P6.

The various operations in method 400d may be performed in the order presented, in a different order or simultaneously. Further, in some embodiments, some operations listed in FIG. 4d may be omitted.

Figure 4E:
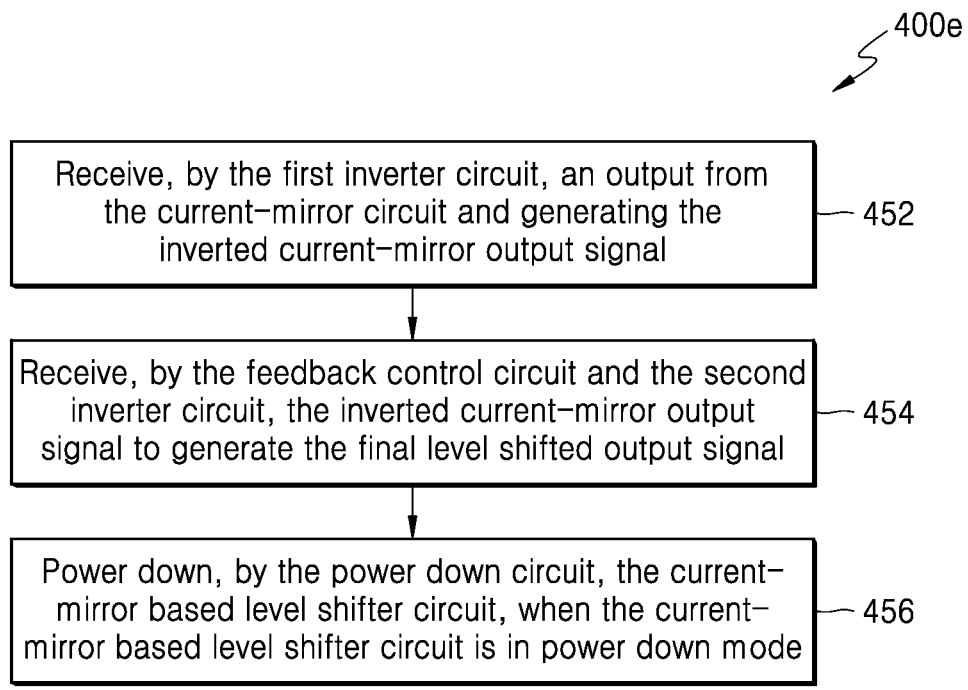
FIG. 4e is flow chart depicting a method for powering down the current-mirror based level shifter circuit, according to an example embodiment.

FIG. 4e is flow chart depicting a method 400e for powering down the current-mirror based level shifter circuit 300, according to an example embodiment.

The method 400e includes, at operation 452, receiving, by the first inverter circuit 304b, an output from the current-mirror circuit 302 and generating the inverted current-mirror output signal. At operation 454, the feedback control circuit 304a and the second inverter circuit 308 receive the inverted current-mirror output signal to generate the final level shifted output signal. At operation 456, the power down circuit 306 powers down the current-mirror based level shifter circuit 300, when the current-mirror based level shifter circuit 300 is in power down mode.

The various operations in method 400e may be performed in the order presented, in a different order or simultaneously. Further, in some embodiments, some operations listed in FIG. 4e may be omitted.

Figure 4F:
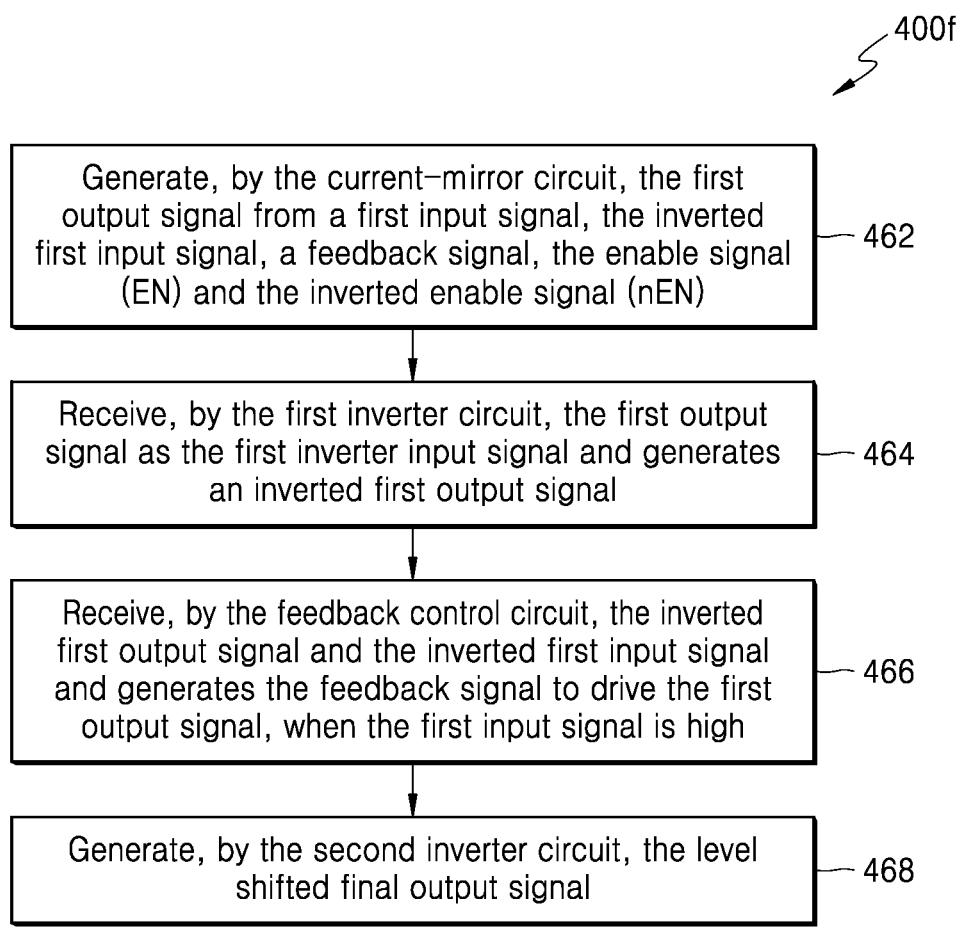
FIG. 4f is flow chart depicting a method for generating a level shifted final output signal, according to an example embodiment.

FIG. 4f is flow chart depicting a method 400f for generating the level shifted final output signal, according to an example embodiment.

The method 400f includes, at operation 462, generating, by the current-mirror circuit 302, the first output signal from a first input signal, the inverted first input signal, a feedback signal, the enable signal (EN) and the inverted enable signal (nEN). At operation 464, the first inverter circuit 304b receives the first output signal as the first inverter input signal and generates an inverted first output signal. At operation 466, the feedback control circuit 304a receives the inverted first output signal and the inverted first input signal and generates the feedback signal to drive the first output signal, when the first input signal is high. At operation 468, the second inverter circuit 308 generates the level shifted final output signal.

The various operations in method 400f may be performed in the order presented, in a different order or simultaneously. Further, in some embodiments, some operations listed in FIG. 4f may be omitted.

The current-mirror based level shifter circuit according to the example embodiments herein may reduce leakage currents or contention currents. The example embodiments herein may provide a robust solution for wide voltage shifting range with lesser layout area or same layout area. Embodiments herein may provide improved delay performance and may solve floating node issue, which actually drives the output current mirror based circuits, based on feedback loop method.

While example embodiments have been particularly illustrated and described above, it will be apparent to those skilled in the art that various changes and modifications in form and details could be made without departing from the spirit and scope of the present disclosure.

What is claimed is:

1. A current-mirror-based level shifter circuit comprising:
a current-mirror circuit configured to generate at a first node, based on an input signal and a feedback signal, a first output signal;
a feedback control circuit coupled to the current-mirror circuit at the first node, wherein the feedback control circuit comprises a first inverter circuit, a first diode-connected p-channel metal oxide semiconductor (PMOS) transistor, and a second diode-connected PMOS transistor, wherein the feedback control circuit is configured to provide, to the first node based on an inverted input signal and the feedback signal, a first level-shifted output signal, wherein the first inverter circuit is configured to receive the first output signal from the first node;
a power-down circuit coupled to the first node, wherein the power-down circuit is configured to, when the current-mirror-based level shifter circuit is in power-down mode, bring the first node to a low voltage level to power down the current-mirror-based level shifter circuit, and maintain a stable ground voltage level at an output of the current-mirror-based level shifter circuit; and
a second inverter circuit coupled to the feedback control circuit, wherein the second inverter circuit is configured to generate a final level-shifted output signal.

2. The current-mirror-based level shifter circuit of claim 1, wherein the feedback control circuit is further configured to mitigate, based on an arrangement of the first diode-connected PMOS transistor and the second diode-connected PMOS transistor, at least one of a contention current or a switching current in a third PMOS transistor and a fourth PMOS transistor,
wherein the arrangement of the first diode-connected PMOS transistor and the second diode-connected PMOS transistor is configured to suppress a gate-source voltage below a threshold voltage of the fourth PMOS transistor, to turn-off the feedback control circuit during an active low input condition of the current-mirror-based level shifter circuit, and
wherein the third PMOS transistor is coupled to the first node.

3. The current-mirror-based level shifter circuit of claim 1, further comprising:
a third inverter circuit configured to: receive the input signal, and generate the inverted input signal, wherein the inverted input signal is provided to a first n-channel metal oxide semiconductor (NMOS) transistor, a second NMOS transistor and a fourth PMOS transistor, wherein an enable signal is input to the third inverter circuit via a pull-down NMOS transistor; and
a fourth inverter circuit configured to receive the enable signal, generate an inverted enable signal, and provide the inverted enable signal to a third NMOS transistor, a fourth NMOS transistor and a fifth PMOS transistor,
wherein a fifth NMOS transistor of the current-mirror circuit is configured to receive the enable signal, and
wherein the fifth PMOS transistor of the current-mirror circuit is configured to receive the inverted enable signal, and cut-off the current-mirror circuit when the enable signal is active low.

4. The current-mirror-based level shifter circuit of claim 1, wherein the current-mirror circuit further comprises a sixth diode-connected PMOS transistor and a seventh diode-connected PMOS transistor,
wherein the sixth diode-connected PMOS transistor and the seventh diode-connected PMOS transistor are coupled to a high voltage level power supply, and the sixth diode-connected PMOS transistor is coupled to a gate terminal of the seventh diode-connected PMOS transistor;

wherein a fifth n-channel metal oxide semiconductor (NMOS) transistor is configured to receive an enable signal, a fifth PMOS transistor is configured to receive an inverted enable signal, and the fifth NMOS transistor is coupled to the sixth diode-connected PMOS transistor and the fifth PMOS transistor is coupled to the seventh diode-connected PMOS transistor, wherein the current-mirror circuit further comprises a sixth NMOS transistor and a seventh NMOS transistor connected in a series configuration, wherein the sixth NMOS transistor is configured to receive the input signal and the seventh NMOS transistor is configured to receive the feedback signal, wherein the fifth NMOS transistor is coupled to the sixth NMOS transistor, wherein a first NMOS transistor is in the series configuration with a second NMOS transistor, and wherein a source terminal of the second NMOS transistor is coupled to a circuit ground, wherein a third NMOS transistor and a fourth NMOS transistor of the power-down circuit are in the series configuration and the third NMOS transistor is coupled to the first node, and wherein the third NMOS transistor and the fourth NMOS transistor are configured to receive the inverted enable signal, wherein the first diode-connected PMOS transistor, the second diode-connected PMOS transistor, a fourth PMOS transistor and a third PMOS transistor of the feedback control circuit are arranged in the series configuration, and a drain terminal of the third PMOS transistor is coupled to the first node, wherein the third PMOS transistor is configured to receive the feedback signal from the first inverter circuit via the third PMOS transistor, wherein the fourth PMOS transistor is configured to receive the inverted input signal, wherein the first diode-connected PMOS transistor is in the series configuration with the second diode-connected PMOS transistor, and wherein the second diode-connected PMOS transistor is coupled to a source terminal of the fourth PMOS transistor.

5. The current-mirror-based level shifter circuit of claim 1, wherein the current-mirror circuit is configured to receive an enable signal, an inverted enable signal, and a plurality of inverted input signals.

6. The current-mirror-based level shifter circuit of claim 1, further comprising:
a high voltage domain power supply; and
a low voltage domain power supply,
wherein the output of the current-mirror-based level shifter circuit is a level shifted high voltage domain output signal from a low voltage domain signal.

7. The current-mirror-based level shifter circuit of claim 6, wherein a third inverter circuit is configured to receive a first power signal from the low voltage domain power supply, and
wherein the current-mirror circuit, the feedback control circuit, the first inverter circuit, the second inverter circuit, a fourth inverter circuit are configured to receive a second power signal from the high voltage domain power supply.

8. A method for implementing a current-mirror-based level shifter circuit, the method comprising:
generating, by a current-mirror circuit at a first node, a first output signal based on an input signal and a feedback signal;

generating, by a feedback control circuit coupled to the current-mirror circuit at the first node, a level shifted output signal based on receiving an inverted input signal and the feedback signal, wherein the feedback control circuit comprises a first inverter circuit, a first diode-connected p-channel metal oxide semiconductor (PMOS) transistor and a second diode-connected PMOS transistor, providing, to the first node based on the inverted input signal and the feedback signal, a first level-shifted output signal;

receiving, by the first inverter circuit, the first output signal from the first node;

powering down, by a power down circuit coupled to the first node, when an inverted enable signal is high, the current-mirror-based level shifter circuit to maintain a stable ground voltage level at an output of the current-mirror-based level shifter circuit, wherein the powering down comprises bringing the first node to a low voltage level; and generating, by a second inverter circuit and based on the feedback signal, a final level-shifted output signal.

9. The method of claim 8, further comprising:
mitigating, based on an arrangement of the first diode-connected PMOS transistor and the second diode-connected PMOS transistor, at least one of a contention current and a switching current in a third PMOS transistor and a fourth PMOS transistor,
wherein the mitigating comprises suppressing a gate-source voltage below a threshold voltage of the fourth PMOS transistor to turn-off the feedback control circuit during an active low input condition of the current-mirror-based level shifter circuit.

10. The method of claim 8, further comprising:
receiving the input signal;
generating, by a third inverter circuit, the inverted input signal; and
receiving, by a fourth inverter circuit, an enable signal;
generating the inverted enable signal;
providing the inverted enable signal to a third NMOS transistor and a fourth NMOS transistor and a fifth PMOS transistor;
receiving, by the fifth PMOS transistor, the inverted enable signal; and
cutting-off the current-mirror circuit when the enable signal is active low.

11. The method of claim 8, further comprising:
receiving, by the current-mirror circuit, a high voltage level input power supply signal;
receiving, by the current-mirror circuit, an enable signal;
receiving, by the current-mirror circuit, the inverted enable signal;
receiving, by the current-mirror circuit, the input signal;
receiving, by the current-mirror circuit, the inverted enable signal;
receiving, by the current-mirror circuit, the inverted input signal;
receiving, by the power down circuit, the inverted enable signal;
receiving, by the feedback control circuit, the feedback signal from the first inverter circuit; and
receiving, by the feedback control circuit, the inverted input signal.

12. The method of claim 8, further comprising:
receiving, by the current-mirror circuit, an enable signal;
receiving, by the current-mirror circuit, the inverted enable signal; and receiving, by the current-mirror circuit, a plurality of inverted input signals.

13. The method of claim 8, wherein the current-mirror-based level shifter circuit comprises a high voltage domain power supply and a low voltage domain power supply, and the final level-shifted output signal is a level-shifted high voltage domain output signal derived from a low voltage domain signal.

14. A current-mirror-based level shifter circuit comprising:
a current-mirror circuit;
a first inverter circuit configured to:
receive an output from the current-mirror circuit, and generate an inverted current-mirror output signal;
a feedback control circuit;
a second inverter circuit, wherein the feedback control circuit and the second inverter circuit are configured to:
receive the inverted current-mirror output signal, and generate a final level shifted output signal; and
a power-down circuit, wherein the power-down circuit is configured to power down the current-mirror-based level shifter circuit by bringing an input of the first inverter circuit to a ground voltage, when an inverted enable signal is high,
wherein, the feedback control circuit is further configured to receive an inverted first output signal and an inverted input signal.

15. The method of claim 13, further comprising:
receiving, by a third inverter circuit, a low voltage domain power supply signal from the low voltage domain power supply; and
receiving, by the current-mirror circuit, the feedback control circuit, the first inverter circuit, the second inverter circuit, and a fourth inverter circuit a high voltage domain power supply signal from the high voltage domain power supply.

16. The current-mirror-based level shifter circuit of claim 14, wherein,
the current-mirror circuit is configured to generate, based on an input signal, the inverted input signal, a feedback signal, an enable signal and the inverted enable signal, a first output signal;
the first inverter circuit is further configured to generate, based on the first output signal, the inverted first output signal;
the feedback control circuit is further configured to generate when the input signal is high, the feedback signal to drive the first output signal; and
the second inverter circuit is further configured to generate, a level shifted final output signal, wherein the second inverter circuit is coupled to an output of the first inverter circuit.

17. The current-mirror-based level shifter circuit of claim 14, wherein the feedback control circuit is further configured to mitigate at least one of a contention current or a switching current during an active low input condition of the current-mirror-based level shifter circuit.

18. The current-mirror-based level shifter circuit of claim 16, further comprising:
a third inverter circuit configured to: receive the input signal, and generate the inverted input signal, wherein the enable signal is input to the third inverter circuit; and
a fourth inverter circuit configured to receive the enable signal, generate a second inverted enable signal, and provide the inverted enable signal to the feedback control circuit,
wherein a cut-off of the current-mirror circuit is enabled when the enable signal is active low.

19. The current-mirror-based level shifter circuit of claim 14, wherein the current-mirror circuit is configured to receive an enable signal, the inverted enable signal, and the inverted input signal.

20. The current-mirror-based level shifter circuit of claim 14, further comprising:
a high voltage domain power supply; and
a low voltage domain power supply,
wherein the final level shifted output signal of the current-mirror-based level shifter circuit is a level shifted high voltage domain output signal from a low voltage domain signal.

* * * * *